United States Patent [19]

Hama

[11] 3,829,712

[45] Aug. 13, 1974

[54] FREQUENCY DIVIDER CIRCUIT INCORPORATING PRESETTING MEANS

[75] Inventor: Tetsuro Hama, Suwa, Japan

[73] Assignee: Kabushiki Kaisha Suwa Seikosha, Tokyo, Japan

[22] Filed: Dec. 29, 1971

[21] Appl. No.: 215,959

[30] Foreign Application Priority Data

Dec. 30, 1970 Japan .............................. 45-127219

[52] U.S. Cl. ................ 307/225 C, 307/279, 328/48

[51] Int. Cl. ............................................ H03k 23/08

[58] Field of Search ........... 307/289, 290, 291, 220, 307/225, 279; 328/48

[56] References Cited

UNITED STATES PATENTS 3,493,785 2/1970 Rapp .................................. 307/214

3,679,913 7/1972 Foltz .................................. 307/289

*Primary Examiner*—John S. Heyman

*Attorney, Agent, or Firm*—Blum, Moscovitz, Friedman & Kaplan

[57] ABSTRACT

A frequency divider circuit having master-slave type flip-flop binary circuits formed from complementary insulated gate field effect transistors. Presetting means incorporated in one of the master or slave flip-flop circuits, the clock signal for the flip-flop circuit not having said presetting means is adapted so that said flip-flop circuit is subordinate to the flip-flop circuit incorporating the presetting means during the presetting operation.

8 Claims, 4 Drawing Figures

PRIOR ART

FREQUENCY DIVIDER CIRCUIT INCORPORATING PRESETTING MEANS

BACKGROUND OF THE INVENTION

This invention relates to frequency divider circuits formed from complementary type insulated gate field effect transistors, and in particular, to presetting means for such circuits. Frequency dividing circuits are generally incorporated in electric timepieces, such as electric wristwatches, wherein a time standard oscillator produces a high frequency signal which must be divided by dividing circuitry in order to produce low frequency timing signals for driving the time indication means.

In such timepieces, when time duration is to be set, it is necessary not only to set the initial state of the indication mechanism, but also to set the divider circuit at zero. When the watch is maintained at rest, it is desirable that the oscillation of the time standard oscillator be maintained, in order to maintain the accuracy of the timepiece.

In the art, divider circuits incorporating presetting means have included many redundant structures which are eliminated by the arrangement according to the invention.

SUMMARY OF THE INVENTION

Generally speaking, in accordance with the invention, a frequency divider circuit is provided incorporating a master flipflop binary circuit and a slave flip-flop binary circuit, said circuits being formed of complementary insulated gate field effect transistors. One of said master and slave type binary circuits includes presetting means, the other of said master and slave binary circuits having clock signals applied thereto so that it is subordinate to the binary circuit incorporating said presetting means during the presetting operation.

A plurality of said divider circuits may be connected in series as a divider chain, said divider chain including an input circuit for cutting off said clock signal during the presetting operation.

Accordingly, it is an object of this invention to provide presetting means for a divider circuit in order to simplify the construction of said divider circuit, and in order to reduce power consumption during the time that the watch is maintained at rest.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
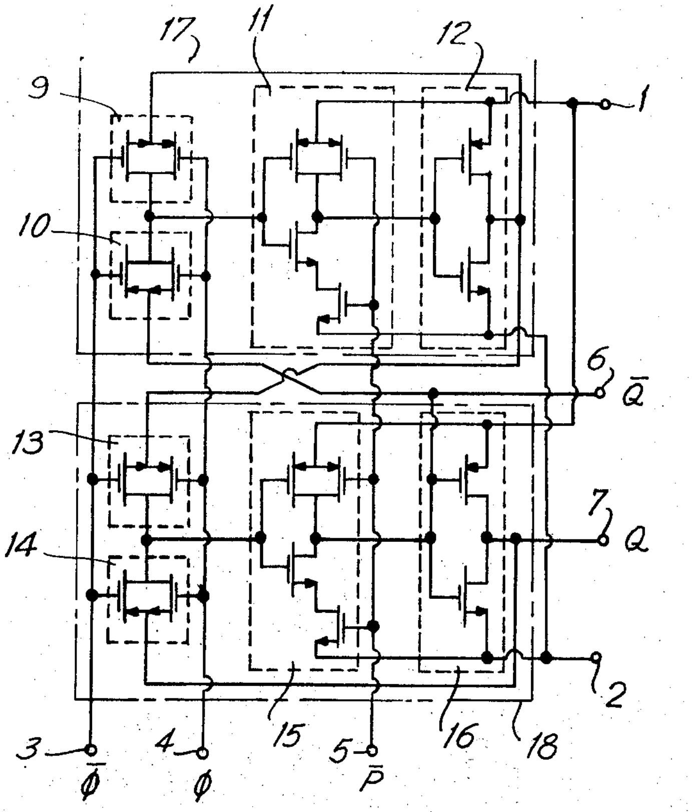
FIG. 1 PRIOR ART
FIG. 1 is a circuit diagram of a prior art binary frequency dividing circuit.

Referring now to FIG. 1, a prior art binary divider circuit is depicted. Said circuit is of the master-slave type formed from complementary type insulated gate field effect transistors (hereinafter referred to as "CMOS transistors"). In said circuit, terminals 1 and 2 would be connected across an electric power source, terminal 1 having a positive potential relative to the potential of terminal 2. The master flip-flop 17 is formed from a first transfer gate 9, a second transfer gate 10, a first NAND circuit 11 and a first inverter 12. The slave flip-flop 18 includes a third transfer gate 13, a fourth transfer gate 14, a second NAND circuit 15 and a second inverter 16.

Clock signals $\overline{\phi}$ and $\phi$ are applied to terminals 3 and 4 respectively. Clock signals $\overline{\phi}$ and $\phi$ are identical signals of opposite phase. First transfer gate 9 and third transfer gate 13 are formed so as to be placed in a signal transfer state (hereinafter referred to as the ON state) when clock signal $\overline{\phi}$ is at a high potential (hereinafter referred to as H potential), and in a signal interruption state (hereinafter referred to as the OFF state) when clock signal $\overline{\phi}$ on terminal 3 is at a low potential (hereinafter referred to as L potential). Similarly, second transfer gate 10 and fourth transfer gate 14 are adapted so as to be in the ON state when the clock signal $\phi$ on terminal 4 is at H potential and to be in the OFF state when the clock signal $\phi$ is at the L potential.

First NAND circuit 11 and second NAND circuit 15 serve as inverters when a preset signal $\overline{P}$ of H potential is applied to terminal 5. First NAND circuit 11 serves to invert the output of one of transfer gates 9 or 10, while second NAND circuit 15 serves to invert the output of one of transfer gates 13 or 14. When preset signal $\overline{P}$ on terminal 5 is at L potential, the output of NAND circuits 11 and 15 remains at the H potential independent of the output of transfer gates 9 or 10 and transfer gates 13 or 14.

In the usual case, where preset signal $\overline{P}$ on terminal 5 is at the H potential, master flip-flop 17 is maintained at its then state through first transfer transfer gate 9 if clock signal $\overline{\phi}$ on terminal 3 is at H potential. The state of master flip-flop 17 is applied to slave flip-flop 18 through the third transfer gate 13. If clock signal $\phi$ on terminal 4 is at H potential, slave flip-flop 18 is maintained in its then state through fourth transfer gate 14 and a state opposite to the state of slave flip-flop 18 is applied to master flip-flop 17 through second transfer gate 10. Thus, during two periods of the cycle of clock $\overline{\phi}$ on terminal 3 or the clock $\phi$ on terminal 4, a signal of a single period representative of half the frequency of the clock signal is obtained at the output $\overline{Q}$ at terminal 6 or the output Q at terminal 7.

Where the divider circuit of FIG. 1 is part of a binary divider circuit chain, the output $\overline{Q-1}$ and Q–1 of the previous stage would be applied as clock signals to terminals 3 or 4 respectively of the divider circuit of FIG. 1, said prior stage output signals corresponding to clock signals $\overline{\phi}$ and $\phi$.

In the arrangement of FIG. 1, either master flip-flop 17 or slave flip-flop 18 is in a subordinate relation to the other at each point in the cycle, so that the preset circuit means may be eliminated from one of the master or slave flip-flops, provided the phase of the input flip-flop is adequately set as more particularly described below.

Figure 2:
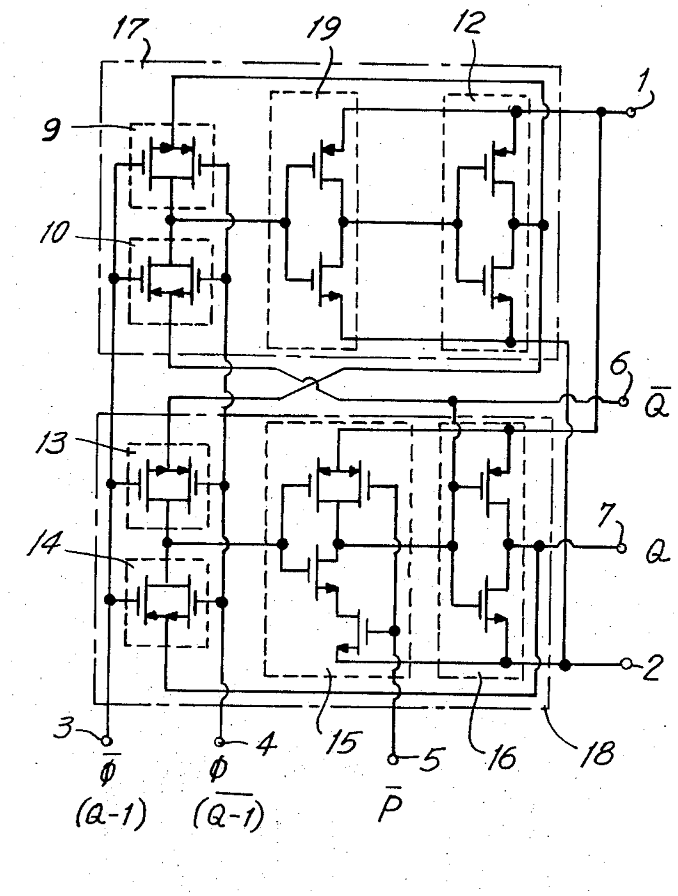
FIG. 2 is a circuit diagram of the binary frequency dividing circuit according to the invention.

One example of a binary divider circuit according to the invention incorporating this principal is depicted in FIG. 2. The circuit of FIG. 2 is similar in construction to the circuit of FIG. 1 except that first NAND circuit 11 of FIG. 1 is replaced by third inverter 19. Further, clock signal $\overline{\phi}$ on terminal 3 and clock signal $\phi$ on terminal 4 is specifically identified as the outputs Q–1 and $\overline{Q-1}$ respectively of the prior stage. If the preset signal $\overline{P}$ at terminal 5 of FIG. 2 is at the L potential representative of the preset state, the output $\overline{Q}$ at terminal 6 of slave flip-flop 18 is at the H potential when clock signal $\phi$ ($\overline{Q-1}$) at terminal 4 is at H potential and clock signal $\overline{\phi}$ (Q–1) at terminal 3 is at L potential. A state opposite to the state of slave flip-flop 18 is automatically applied to master flip-flop 17, which is in the subordinate state.

On the other hand, when preset signal $\overline{P}$ on terminal 5 is at the H potential, the circuit of FIG. 2 functions as a binary frequency dividing circuit similar to that of FIG. 1.

Another embodiment of the divider circuit according to the invention could be produced by modifying the circuit of FIG. 1 by substituting second NAND circuit 15 with an inverter, substituting inverter 19 with first NAND circuit 11, and applying prior stage output $\overline{Q-1}$ to terminal 3 as clock $\overline{\phi}$ and prior stage output signal Q–1 to terminal 4 as clock $\phi$. Thus, in the arrangement according to the invention, it is sufficient to apply the presetting means to only one of the master and slave flip-flops, as determined by the phase of the input clock applied thereto.

Figure 3:
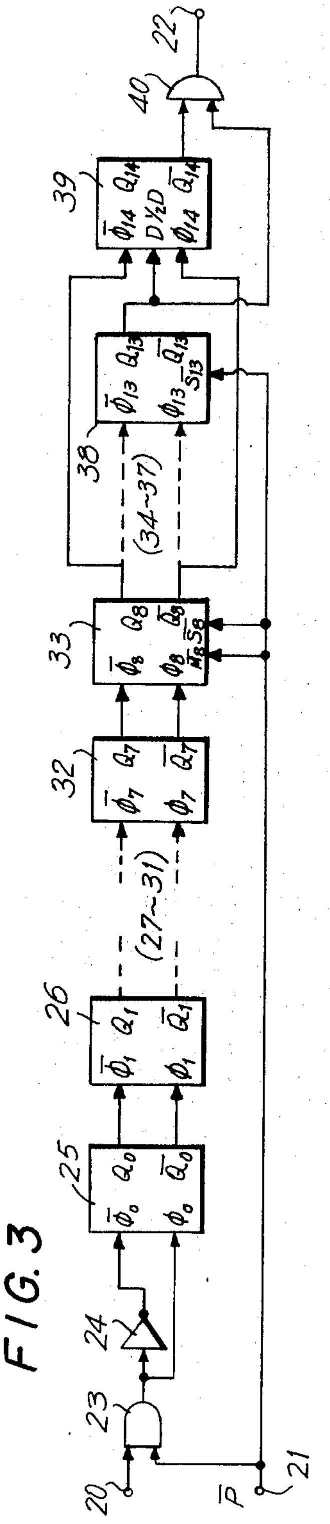
FIG. 3 is a block diagram of a divider chain incorporating the divider circuit of FIG. 2.

Referring now to FIG. 3, a block diagram of a divider circuit chain as applied to an electronic watch is depicted. A time standard signal of 16,384 Hz is applied to an input terminal 20. When preset signal $\overline{P}$ applied to terminal 21 is at H potential, the time standard signal applied to the input terminal 20 passes to clock terminals $\overline{\phi}_0$ and $\phi_0$ of binary divider circuit 25 through a NAND circuit 23 and an inverter 24. Binary divider circuit 25 represents the first stage of the binary divider circuit chain 25–32 (eight stages). None of stages 25–32 are provided with preset means in accordance with the invention. Each further stage 33–38 is formed as depicted in FIG. 2, with the preset means applied to the slave flip-flop. In FIG. 3, $\overline{\phi}_0, \overline{\phi}_1, \ldots, \overline{\phi}_{14}$ and $\phi_0, \phi_1, \ldots, \phi_{14}$ are, respectively, clock signals of opposite phase. Similarly, $\overline{Q}_0, \overline{Q}_1, \ldots, \overline{Q}_{14}$, and $Q_0, Q_1, \ldots, Q_{14}$ are output signals of opposite phase in each of the respective stages. $\overline{S}_8, \overline{S}_9, \ldots, \overline{S}_{13}$ represent the terminal in each stage to which the preset signal $\overline{P}$ from terminal 21 is applied. In the presence of such a preset signal, which is applied to the slave flip-flop of each of stages 33–38, the respective outputs $\overline{Q}_8, \overline{Q}_9, \ldots, \overline{Q}_{13}$ are preset to the H potential. As mentioned before, binary divider circuit chain 33–38 performs the usual frequency dividing action when preset signal $\overline{P}$ applied to terminal 21 is at the H potential. A 1/2 delay circuit 39 is provided at the end of the chain. The frequency dividing output $Q_{13}$ from stage 38, having a frequency of one Hz is applied to input terminal D of delay circuit 39. The outputs $Q_8$ and $\overline{Q}_8$ from stage 33 are respectively applied to terminals $\overline{\phi}_{14}$ and $\phi_{14}$ of said delay circuit. The one Hz signal from stage 38 is delayed by a period equal to the period of the output of stage 33 one sixty-fourth second) by delay circuit 39. The delayed output $\overline{Q}_{14}$ of said delay circuit and the frequency dividing output $Q_{13}$ from stage 38 are applied to NAND circuit 40, which serves to produce an output pulse of L potential and of one sixty-fourth second in duration, once each second.

Thus, in the arrangement of FIG. 3, when the preset signal $\overline{P}$ at terminal 21 is at the H potential, the time standard signal of 16,384 Hz applied to input terminal 20 is frequency divided to a 1 Hz signal through binary frequency circuit chain 25–38. By means of delay circuit 39 and NAND circuit 40, a pulse signal of one sixty-fourth in width and one second in period, and of L potential, is produced at output terminal 22.

In the preset state when preset signal $\overline{P}$ at terminal 21 is at L potential, NAND circuit 23 produced an output independent of input 20, and inverter 24, binary frequency dividing circuit chain 25–38, delay circuit 39 and NAND circuit 40 come to the rest state. In the rest state, the circuit elements, which are formed of CMOS, consume only negligible amounts of power. In CMOS circuit elements, power consumption due to discharge of capacity in the transition state occupies a major portion of the consumed power. Since the output $Q_{14}$ of delay circuit 39 is set so as to correspond with output $Q_{13}$ of stage 38 when clock $\phi_{14}$ ($\overline{Q}_8$) is at H potential, the output of NAND circuit 40 is also at said H potential. For this reason, no power consumption occurs in the driving circuit (not shown) connected to the NAND circuit. Accordingly, power consumption is substantially reduced when the watch is maintained at rest for a long duration, while not stopping the time standard signal.

Figure 4:
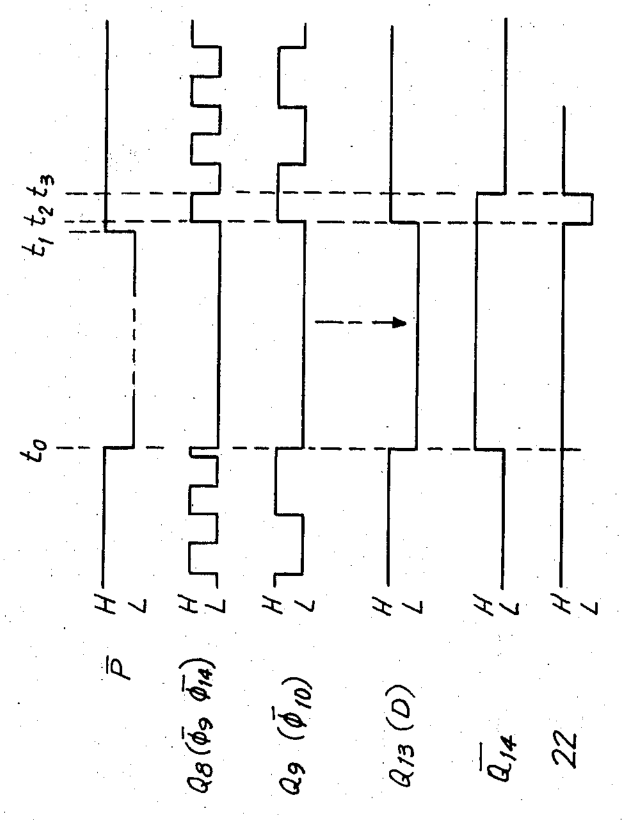
FIG. 4 depicts the wave forms at various points in the divider chain of FIG. 3.

The preset action for setting an indication time is explained in connection with the waveforms of FIG. 4, which represent plots of potential versus time $t$ for $\overline{P}$, $Q_8$, $Q_9$, $Q_{13}$, $\overline{Q}_{14}$, and terminal 22. If a preset operation occurs at time $t_0$ the binary divider circuit chain operates as described above, and the second indication is set at 59 seconds by a mechansim not shown. When the preset operation is released, at the instant that the time standard indicates the correct time, the output $Q_8$ of binary divider circuit 33 changes to the H potential at a time $t_2$ thereafter. Time $t_2$ is a time within one sixty-fourth second (one period of the binary divider circuit 32) from time $t_1$ at which the presetting operation was released. Since, during the time from $t_0$ to $t_2$, the master flip-flop of binary divider circuit 34 is placed in the opposite state to that of the corresponding flip-flop of stage 33. At the instant that $\overline{\phi}_9$ ($Q_8$) changes to H potential at time $t_2$, a signal of the same phase is sent from the master flip-flop to the slave flip-flop of binary divider circuit 34, and the output $Q_9$ thereof changes to the H potential. Afterwards, a similar action occurs one after another in each stage of the binary divider circuit chain 35–38, bringing $Q_{13}$ to the H potential.

Since clock $\overline{\phi}_{14}$ ($Q_8$) applies a delay of one sixty-fourth second of the amount of the H potential period, as described above, $\overline{Q}_{14}$ of delay circuit 39 changes to the L potential at time $t_3$. Time $t_3$ is one sixty-fourth second after time $t_2$. In binary divider stage 33, master flip-flop $\overline{M}_8$ is also preset so as to maintain the time interval $t_2 - t_3$. Accordingly, a pulse signal of 1/64 second duration at L potential starting at time $t_2$ is produced at terminal 22, as depicted in the waveform of FIG. 4. Said signal starts less than one sixty-fourth second after the time $t_1$ when the presetting operation is released.

The correct time in seconds is then indicated through a mechanism not shown.

The foregoing arrangement for setting correct time in seconds involves a delay of time of the order of one sixty-fourth second, but such delay is not troublesome in practice, considering the fact that the operation is performed artifically.

If the circuit is of the type in which, at the time of presetting, the second indication of the watch is correctly set, the continuation of second indication starting after one second, the application of the preset means of FIG. 3 to the master flip-flip makes Q–1 and $\overline{Q-1}$ correspond to $\phi$ and $\overline{\phi}$ respectively in the phase condition of the binary divider circuit 33. In such case, clock $\phi$ of the binary divider circuit 33 is obtained by setting same so as to be at H potential at the time of presetting. The foregoing arrangement is particularly adapted to simplify the divider circuitry of electronic watches, and to aid in the miniaturization thereof. THe circuit is of increased reliability and consumes reduced power when the watch is at rest.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A frequency divider circuit comprising master flip-flop means; slave flip-flop means coupled to said master flip-flop means; and means coupling said master and slave flip-flop means so that upon the application of a pair of inverse clock signals of a first frequency thereto, an output of a second frequency equal to one-half of said frequency is produced, only one of said master and slave flip-flop means including presetting means, said clock signals being applied to said master and slave flip-flop means so that the one of said master and slave flip-flop means not including said presetting means is subordinate to the other of said master and slave flip-flop circuit means during presetting.

2. A divider circuit as recited in claim 1, wherein each of said master and slave flip-flop means includes first and second transfer gate means, said first transfer gate means being placed in a conductive state by one of said pair of clock signals, said second transfer gate means being placed in a conductive state by the other of said pair of clock signals; the one of said master and slave flip-flop means not including said presetting means including first and second series connected inverter means connected to the output of the corresponding first and second transfer gate means, the other of said master and slave flip-flop means including said presetting means connected to the output of the associated first and second transfer gate means, and inverter means connected to the output of said presetting means.

3. A divider circuit as recited in claim 2, wherein said presetting means includes NAND circuit means having as its first input the output of the associated first and second transfer gate means, and having as its second input a presetting signal.

4. A divider circuit as recited in claim 1, including a plurality of said divider circuits connected in a binary chain; the clock pulses for the divider circuits of said chain other than the first of said divider circuits being the output signals of the prior stage of said chain; and input circuit means for applying the clock signals to the first stage of said binary chain and for cutting off said clock signals during presetting.

5. A divider circuit as recited in claim 4, including waveform shaping circuit means for receiving the output signals of the last stage of said binary chain and the output signals of an intermediate stage for producing a pulse output signal.

6. A divider circuit as recited in claim 2, wherein the first transfer means of said master flip-flop means is connected to the output of said master flip-flop means for transmission thereof when in a conductive state, the second transfer gate means of said slave flip-flop means being connected to the output of said slave flip-flop means to transmit said output when in a conductive state, said coupling means interconnecting the output of said master flip-flop means to the first transfer means of said slave flip-flop means to transmit said output when conductive, said coupling means connecting the inverse of the output of said slave flip-flop means to the second transfer switch means of said master flip-flop means to transmit said output when rendered conductive.

7. A divider circuit as recited in claim 6, including a plurality of said divider circuits connected in a binary chain, the clock signals of each stage in said binary chain other than the first stage being the output signals of the previous stage, said presetting means being incorporated in said slave flip-flop means, the first transfer gate means of each of said master and slave flip-flop means being rendered conductive in response to the output signal of the prior stage, the second transfer gate means of each of said first and second flip-flop means being rendered conductive in response to the inverse of said prior stage output signal.

8. A divider circuit as recited in claim 6, including a plurality of said divider circuits connected in a binary chain, the clock signals for each stage in said binary chain other than the first stage being the output signals of the prior stage, said master flip-flop means including said presetting means, the first transfer gate means of each of said master and slave flip-flop circuit means being rendered conductive in response to the inverse of the prior stage output signal, the second transfer gate means of each of said master and flip-flop means being rendered conductive in response to said prior stage output signal.

* * * * *